United States Patent
Chen et al.

(10) Patent No.: US 11,127,572 B2
(45) Date of Patent: Sep. 21, 2021

(54) L-SHAPED PLASMA CONFINEMENT RING FOR PLASMA CHAMBERS

(71) Applicant: Silfex, Inc., Eaton, OH (US)

(72) Inventors: Jihong Chen, Cincinnati, OH (US); Yi Song, Cincinnati, OH (US)

(73) Assignee: SILFEX, INC., Eaton, OH (US)

( * ) Notice: Subject to any disclaimer, the term of this patent is extended or adjusted under 35 U.S.C. 154(b) by 176 days.

(21) Appl. No.: 16/057,226

(22) Filed: Aug. 7, 2018

(65) Prior Publication Data
US 2020/0051792 A1 Feb. 13, 2020

(51) Int. Cl.
*H01J 37/32* (2006.01)
*H01L 21/67* (2006.01)

(52) U.S. Cl.
CPC .. *H01J 37/32623* (2013.01); *H01J 37/32715* (2013.01); *H01L 21/67017* (2013.01)

(58) Field of Classification Search
USPC ...... 156/345.43–345.47; 118/723 E, 723 ER, 118/723 R
See application file for complete search history.

(56) References Cited

U.S. PATENT DOCUMENTS

| | | | |
|---|---|---|---|
| 5,376,214 A | 12/1994 | Iwasaki et al. | |
| 6,096,161 A * | 8/2000 | Kim | H01J 37/32623 156/345.47 |
| 6,171,453 B1 * | 1/2001 | Chung | C23C 14/50 118/503 |
| 6,527,911 B1 * | 3/2003 | Yen | H01J 37/32568 118/723 E |
| 7,378,128 B2 | 5/2008 | Rancoule | |
| 8,177,910 B2 | 5/2012 | Schmid et al. | |
| 8,485,128 B2 | 7/2013 | Kellogg et al. | |
| 8,826,855 B2 | 9/2014 | Kellogg et al. | |
| 9,779,916 B2 | 10/2017 | Dhindsa et al. | |
| 10,096,471 B2 | 10/2018 | Canniff | |
| 2003/0218427 A1 * | 11/2003 | Hoffman | H01J 37/32091 315/111.41 |
| 2004/0035532 A1 * | 2/2004 | Jung | H01J 37/32082 156/345.43 |
| 2004/0159286 A1 * | 8/2004 | Aoki | H01J 37/32633 118/723 E |

(Continued)

FOREIGN PATENT DOCUMENTS

JP 2003109939 * 4/2003

OTHER PUBLICATIONS

Machine Translation JP2003109939, Kajiwara (Year: 2003).*
International Search Report and Written Opinon for PCT Applicaiton No. PCT/US2019/045085 dated Dec. 20, 2019.

*Primary Examiner* — Rakesh K Dhingra (57) ABSTRACT

A plasma confinement ring for a plasma chamber comprises a ring-shaped element and a cylindrical element. The ring-shaped element of the plasma confinement ring surrounds a substrate support assembly in the plasma chamber and is arranged along a plane in which a substrate is arranged on the substrate support assembly. The ring-shaped element includes a plurality of orifices. The cylindrical element of the plasma confinement ring extends from an outer edge of the ring-shaped element in a direction perpendicular to the plane in which the substrate is arranged on the substrate support assembly in the plasma chamber. The plasma confinement ring is monolithic.

8 Claims, 6 Drawing Sheets

(56) References Cited

U.S. PATENT DOCUMENTS

| | | | |
|---|---|---|---|
| 2006/0225655 A1* | 10/2006 | Faguet | C23C 16/4401 |
| | | | 118/723 R |
| 2006/0283551 A1 | 12/2006 | Son | |
| 2007/0283882 A1 | 12/2007 | Cho et al. | |
| 2008/0257263 A1* | 10/2008 | Pavloff | H01J 37/32477 |
| | | | 118/723 R |
| 2008/0317564 A1 | 12/2008 | Cheng et al. | |
| 2010/0197070 A1 | 8/2010 | Stoddard et al. | |
| 2011/0005685 A1* | 1/2011 | Nguyen | H01J 37/321 |
| | | | 156/345.43 |
| 2011/0030898 A1* | 2/2011 | Sato | H01L 21/67069 |
| | | | 156/345.24 |
| 2011/0108524 A1 | 5/2011 | Dhindsa et al. | |
| 2011/0259262 A1 | 10/2011 | Khattak et al. | |
| 2012/0000608 A1* | 1/2012 | Kellogg | H01J 37/32623 |
| | | | 156/345.43 |
| 2012/0080092 A1 | 4/2012 | Singh et al. | |
| 2012/0280429 A1 | 11/2012 | Ravi et al. | |
| 2012/0282162 A1 | 11/2012 | Skelton et al. | |
| 2012/0312800 A1 | 12/2012 | Chartier et al. | |
| 2014/0034243 A1 | 2/2014 | Dhindsa et al. | |
| 2014/0272459 A1 | 9/2014 | Daugherty et al. | |
| 2015/0044873 A1 | 2/2015 | Kellogg | |
| 2015/0099365 A1 | 4/2015 | Chen et al. | |
| 2017/0040148 A1 | 2/2017 | Augustine et al. | |
| 2017/0092467 A1* | 3/2017 | Dhindsa | C23C 16/505 |
| 2019/0326104 A1* | 10/2019 | Asako | H01J 37/32642 |

* cited by examiner

L-SHAPED PLASMA CONFINEMENT RING FOR PLASMA CHAMBERS

FIELD

The present disclosure relates generally to plasma chambers for processing semiconductor substrates and more particularly to an L-shaped plasma confinement ring for plasma chambers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to treat substrates such as semiconductor wafers. Examples of processes that may be performed on a substrate include, but are not limited to, chemical vapor deposition (CVD), atomic layer deposition (ALD), conductor etch, dielectric etch, rapid thermal processing (RTP), ion implant, physical vapor deposition (PVD), and/or other etch, deposition, or cleaning processes. A substrate may be arranged on a substrate support, such as a pedestal, an electrostatic chuck (ESC), etc. in a processing chamber of the substrate processing system. During processing, gas mixtures may be introduced into the processing chamber and plasma may be used to initiate and sustain chemical reactions.

The processing chamber includes various components including, but not limited to, the substrate support, a gas distribution device (e.g., a showerhead, which may also correspond to an upper electrode), a plasma confinement ring or shroud, etc. The substrate support may include a ceramic layer arranged to support a wafer. For example, the wafer may be clamped to the ceramic layer during processing. The substrate support may include an edge ring arranged around an outer portion (e.g., outside of and/or adjacent to a perimeter) of the substrate support. The edge ring may be provided to modify a plasma sheath above the substrate, optimize substrate edge processing performance, protect the substrate support from erosion caused by the plasma, etc. The plasma confinement shroud may be arranged around each of the substrate support and the showerhead to confine the plasma within the volume above the substrate.

SUMMARY

A plasma confinement ring for a plasma chamber comprises a ring-shaped element and a cylindrical element. The ring-shaped element of the plasma confinement ring surrounds a substrate support assembly in the plasma chamber and is arranged along a plane in which a substrate is arranged on the substrate support assembly. The ring-shaped element includes a plurality of orifices. The cylindrical element of the plasma confinement ring extends from an outer edge of the ring-shaped element in a direction perpendicular to the plane in which the substrate is arranged on the substrate support assembly in the plasma chamber. The plasma confinement ring is monolithic.

In other features, the plasma confinement ring further comprises a plurality of threaded holes at a distal end of the cylindrical element to receive screws with which the cylindrical element is attachable to a component of the plasma chamber.

In another feature, the component includes an electrode (an upper electrode) of the plasma chamber.

In another feature, the ring-shaped element, the substrate support assembly, and an electrode (an upper electrode) coupled to a distal end of the cylindrical element define a volume within the plasma chamber in which plasma is confined during processing of the substrate in the plasma chamber.

In another feature, outer diameters of the cylindrical element and the electrode (the upper electrode) are equal.

In another feature, the cylindrical element is a cylindrical wall with a thickness of 3-30 mm and a height of 10-100 mm.

In still other features, a system comprises the plasma confinement ring and a first electrode (a lower electrode) and a second electrode (an upper electrode) of the plasma chamber. The first electrode is disposed in the substrate support assembly. The first electrode is arranged parallel to the plane in which the substrate is arranged on the substrate support assembly. The ring-shaped element surrounds the first electrode. The second electrode is arranged at a height from the first electrode and is parallel to the first electrode. The second electrode extends radially outwardly along the plane toward the cylindrical element and is attachable to a distal end of the cylindrical element.

In another feature, outer diameters of the cylindrical element and the second electrode are equal.

In another feature, the orifices are radially extending slots. The slots extend from an inner area near an inner edge of the ring-shaped element to an outer area near the outer edge of the ring-shaped element.

In another feature, the orifices are made using an abrasive waterjet cutting process.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A processing chamber of a substrate processing system may include a plasma confinement ring or shroud. The shroud may be arranged to confine plasma and other reactants within a desired region in the processing chamber. For example, the shroud may be positioned to surround a substrate support and an upper electrode to confine the plasma within a volume above a substrate and below the upper electrode.

Typically, the plasma confinement shrouds are C-shaped and are machined from a massive block of polycrystalline silicon. Slots or holes (hereinafter collectively called orifices) are fabricated in a lower portion of the C-shaped plasma confinement shrouds to vent gases out of a plasma confinement region within the C-shroud. During fabrication, extensive care needs to be exercised to protect an upper portion and a vertical side wall of the C-shaped plasma confinement shroud.

The present disclosure proposes an L-shaped confinement ring or shroud for use instead of the C-shaped plasma confinement shrouds. There is no upper portion in the L-shaped confinement ring. Consequently, orifices can be fabricated in a lower portion of the L-shaped confinement ring using any suitable method and without the need for any protective measures.

Accordingly, as explained below in further detail, the L-shaped confinement ring provides flexibility in selecting a process that can be used to make the orifices (e.g., radial slots). Further, the L-shaped confinement ring provides ease of serviceability (i.e., the L-shaped confinement ring can be easily replaced when worn due to usage). The L shape (as opposed to the C shape), the flexibility in process selection and the ease of serviceability provide significant cost savings in terms of time and material needed to manufacture the L-shaped confinement ring and to make the orifices in the L-shaped confinement ring.

The present disclosure is organized as follows. An example of a plasma processing chamber utilizing a C-shaped confinement shroud is described with reference FIG. 1. The C-shaped confinement shroud is shown and described in further detail with reference to FIGS. 2A, and 2B. The L-shaped confinement ring according to the present disclosure is shown and described with reference to FIGS. 3A and 3B. Examples of embodiments utilizing the L-shaped confinement ring in the plasma processing chamber of FIG. 1 according to the present disclosure are described with reference to FIGS. 4A and 4B. A method according to the present disclosure for making orifices in the L-shaped confinement ring is shown and described with reference to FIG. 5. Examples of different views of the L-shaped confinement ring according to the present disclosure are shown in FIGS. 6A and 6B. Throughout the present disclosure, the terms shroud and confinement ring are used synonymously and interchangeably.

Figure 1:
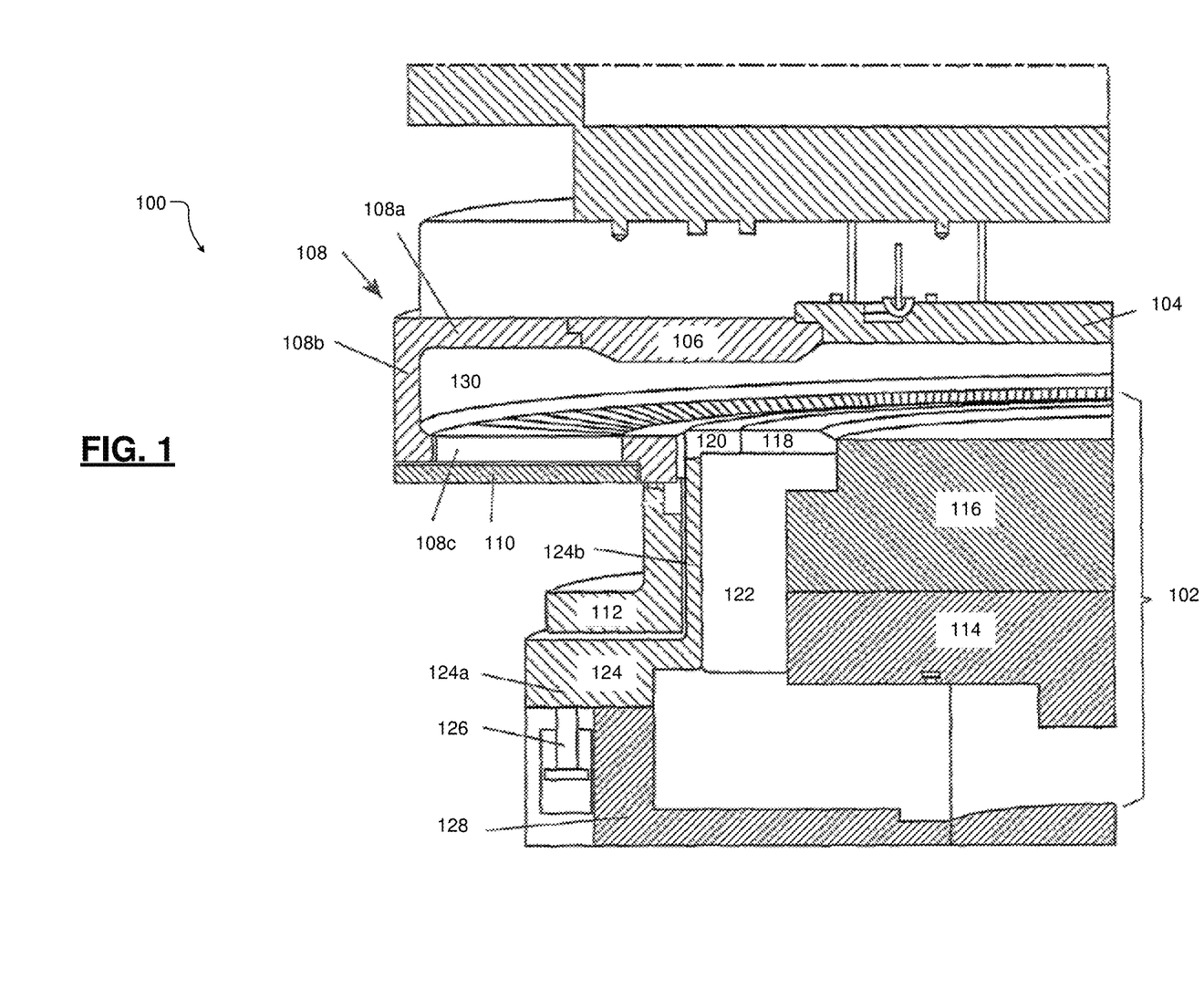
FIG. 1 shows a partial cross-section of a plasma processing chamber.

FIG. 1 shows a partial cross-section of a plasma processing chamber (plasma chamber) 100. The plasma chamber 100 may be used for performing etching using RF plasma, deposition, and/or other suitable substrate processing. The plasma chamber 100 includes a substrate support assembly 102, an upper electrode including a center electrode plate (center electrode or inner electrode) 104 and an annular outer electrode (outer electrode) 106, and a confinement ring 108. The outer electrode 106 surrounds an outer edge of the inner electrode 104. For simplicity, throughout the present disclosure, the inner electrode and the outer electrode shown in all the figures are collectively called the upper electrode. For example, the upper electrode of the plasma chamber 100 includes the inner electrode 104 and the outer electrode 106 and is therefore collectively called the upper electrode 104, 106. A semiconductor substrate (not shown) is supported on the substrate support assembly 102 during processing.

The confinement ring 108 extends outwardly from the outer electrode 106. The confinement ring 108 includes a horizontal upper section (upper portion) 108a extending inwardly towards the outer electrode 106, a vertical section (side portion) 108b extending downwardly from an outer end of the upper portion 108a, and a horizontal lower section (lower portion) 108c extending inwardly from a lower end of the side portion 108b. The lower portion 108c includes a plurality of radially extending slots through which process gas and reaction byproducts are pumped out of the plasma chamber 100. The confinement ring 108 can include a slotted ring 110 below the lower portion 108c. The slotted ring 110 is rotatable and vertically movable relative to the lower portion 108c to adjust flow of process gas and reaction byproducts through the radially extending slots.

The substrate support assembly 102 comprises a movable ground ring 112, a lower electrode 114, an electrostatic chuck (ESC) 116 on which a semiconductor substrate is electrostatically clamped. The substrate support assembly 102 comprises an edge ring 118 having a plasma exposed surface surrounding the ESC 116. The substrate support assembly 102 comprises a dielectric ring 120 having a plasma exposed surface surrounding the edge ring 118. The substrate support assembly 102 comprises an insulator ring 122 beneath the edge ring 118. The substrate support assembly 102 comprises a fixed ground ring 124 of electrically conductive material beneath the dielectric ring 120. A portion 124a of the fixed ground ring 124 surrounds the insulator ring 122. The movable ground ring 112 is supported on depressible plungers 126 supported on a portion 124b of the fixed ground ring 124. The movable ground ring 112 is movable vertically relative to the fixed ground ring 124 so as to make electrical contact with the confinement ring 108. The substrate support assembly 102 is supported on an electrically grounded bias housing 128.

In the plasma chamber 100, the confinement ring 108 is C-shaped and is arranged in the form of a shroud around the upper electrode 104, 106 and the substrate support assembly 102 to confine plasma within a processing volume or a plasma region 130. Accordingly, the confinement ring 108 is also called a C-shaped confinement ring 108 or a C-shroud 108. In some examples, the confinement ring 108 comprises a semiconductor material, such as silicon (Si) or polysilicon (multi-crystalline silicon). The confinement ring 108 may include one or more orifices (e.g., radial slots) arranged to allow gases to flow out of the plasma region 130 to be vented from the plasma chamber 100.

Figure 2A:
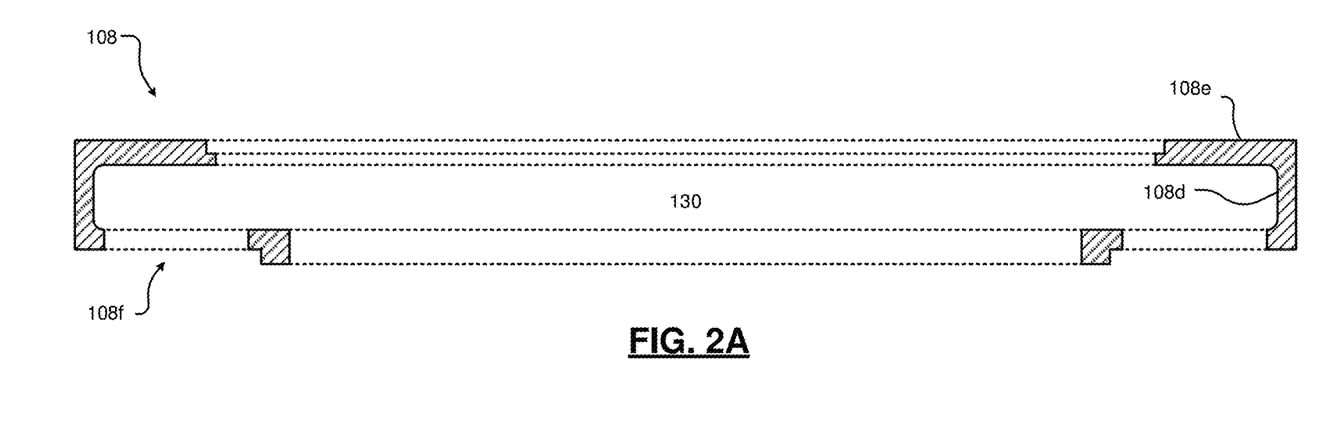
FIGS. 2A and 2B show an example of a C-shaped plasma confinement ring or shroud used in the plasma processing chamber of FIG. 1.

FIG. 2A shows a cross-section of the confinement ring 108. The confinement ring 108 includes inner, plasma-facing surfaces 108d and outer, non-plasma-facing surfaces 108e. The confinement ring 108 may include one or more orifices 108f (e.g., holes or radial slots) for allowing gases to be vented out from the plasma region 130 within the confinement ring 108.

Figure 2B:
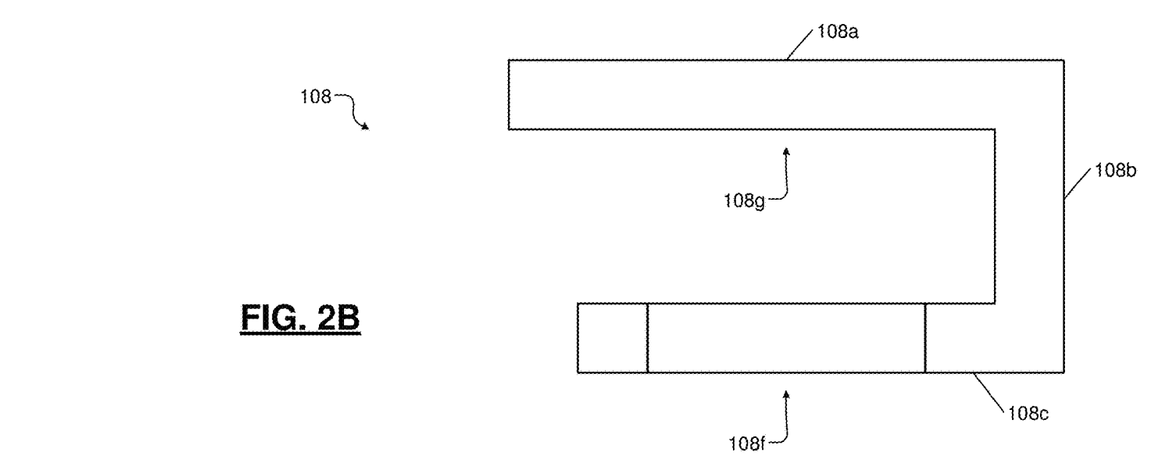

FIG. 2B shows the confinement ring 108 in further detail. The confinement ring 108 is annular. The confinement ring 108 is C-shaped and includes the upper portion 108a, the side portion 108b, and the lower portion 108c. The lower portion 108c includes the orifices 108f. The upper portion 108a extends to the upper electrode 104, 106 shown in FIG. 1.

The C shape of the confinement ring 108 poses various problems. For example, the confinement ring 108 is difficult to manufacture. Specifically, it is difficult to make the confinement ring 108 from a single crystal of silicon since manufacturing the confinement ring 108 requires a very large crystal, which is very expensive and requires extensive machining of very hard material.

Further, it is difficult to make the orifices 108f in the lower portion 108c of the confinement ring 108 since the upper portion 108a of the confinement ring 108 needs to be protected from the process used to make the orifices 108f. Without protective measures, the upper portion 108a of the confinement ring 108 can get damaged (in an area shown at 108g) while the orifices 108f are being made in the lower portion 108c.

The time and expense required to implement the protective measures limit the types of processes that can be used to make the orifices 108f in the lower portion 108c of the confinement ring 108. The need for protective measures and the limits on usable processes make the orifice-making process in the confinement ring 108 very complex, time consuming, expensive, and therefore less attractive from a manufacturing standpoint. Additionally, the confinement ring 108 is difficult to replace after wear and tear that occur due to usage.

Figure 3A:
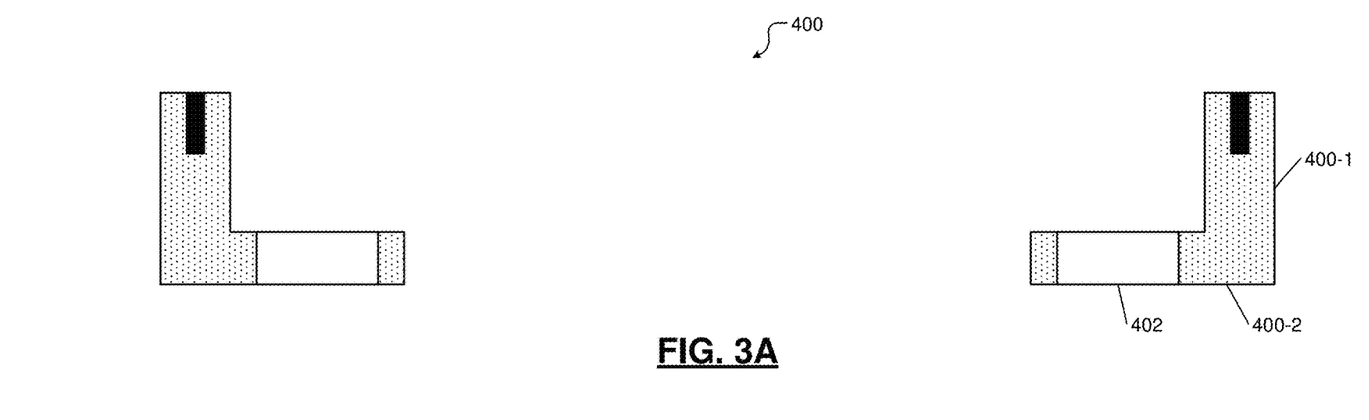
FIG. 3A shows an L-shaped confinement ring for use in the plasma processing chamber of FIG. 1 according to the present disclosure.

FIG. 3A shows an L-shaped confinement ring 400 according to the present disclosure. The L-shaped confinement ring 400 comprises a side portion (or cylindrical wall) 400-1 and a lower (ring-shaped) portion 400-2. The L-shaped confinement ring 400 does not include an upper portion similar to the upper portion 108a of the C-shaped confinement ring 108.

In the L-shaped confinement ring 400, not having the upper portion similar to the upper portion 108a of the C-shaped confinement ring 108 provides many advantages. For example, the amount of silicon needed to manufacture the L-shaped confinement ring 400 is less than that needed to manufacture the C-shaped confinement ring 108. Additionally, the L-shaped confinement ring 400 allows use of virtually any process for making a plurality of orifices 402 in the lower (ring-shaped) portion 400-2. Further, the L-shaped confinement ring 400 is easier to replace than the C-shaped confinement ring 108 (as explained below).

Accordingly, the L-shaped confinement ring 400 provides both flexibility in manufacturing and ease of serviceability because the L-shaped confinement ring 400 does not include an upper portion similar to the upper portion 108a of the C-shaped confinement ring 108. These advantages yield significant savings in time, material, and cost involved in manufacturing and servicing.

Figure 3B:
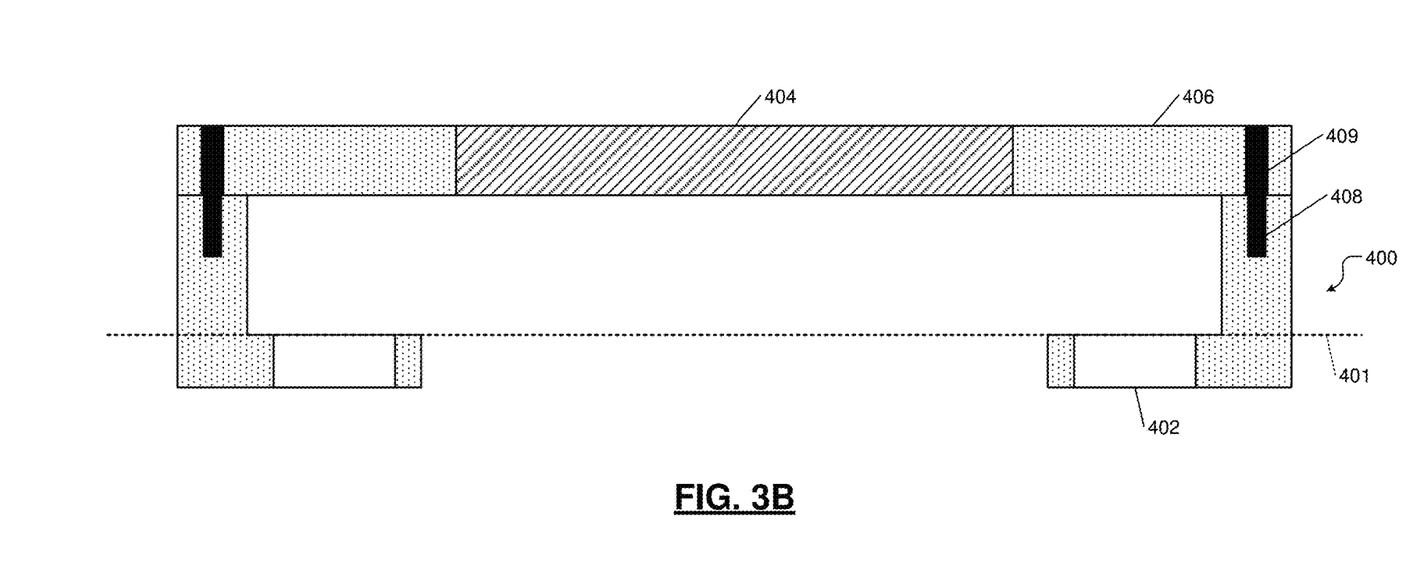
FIG. 3B shows a C-shaped shroud formed using the L-shaped confinement ring for use in the plasma processing chamber of FIG. 1 according to the present disclosure.

FIG. 3B shows a C-shaped shroud formed using the L-shaped confinement ring 400 and an upper electrode with an extended outer portion according to the present disclosure. The C-shroud comprises an upper portion (i.e., an enlarged upper electrode comprising an inner electrode 404 and an outer electrode 406) and an L-shaped lower portion (i.e., the L-shaped confinement ring 400). The combination of the inner electrode 404 and the outer electrode 406 may be generally called the upper electrode or the upper electrode having an outer portion.

The L-shaped confinement ring 400 includes a lower ring (i.e., the lower portion 400-2 with a plurality of orifices 402) and a cylindrical wall (i.e., the side portion 400-1). The lower ring 400-2 and the cylindrical wall 400-1 are made of one piece. That is, the L-shaped confinement ring 400 is monolithic. The cylindrical wall 400-1 extends vertically or perpendicularly upwards from an outer edge of the lower ring 400-2. In a plasma chamber (e.g., the plasma chamber 100), the lower ring 400-2 is arranged along a plane 401 in which a substrate is arranged on the substrate support assembly in the plasma chamber.

At a distal (upper) end of the cylindrical wall 400-1, the L-shaped confinement ring 400 comprises holes 408 to connect to the outer electrode 406 that extends radially outwardly from the inner electrode 404. The holes 408 may comprise threads for receiving screws through holes 409 in the outer electrode 406 with which the outer electrode 406 is screwed to the L-shaped confinement ring 400.

Notably, the L-shaped confinement ring 400 does not include an upper portion that is analogous to the upper portion 108a of the C-shaped confinement ring 108, which extends to the upper electrode 104, 106 as shown in FIG. 1. Instead, as FIG. 3B shows, the outer electrode 406 (analogous to element 106 of FIG. 1) extends from the inner electrode 404 (analogous to element 104 of FIG. 1) to the upper end of the side portion (i.e., the cylindrical wall) 400-1 of the L-shaped confinement ring 400. Accordingly, the present disclosure proposes using the inner electrode 404, the outer electrode 406, and the L-shaped confinement ring 400 in place of the upper electrode 104, 106 and the C-shaped confinement ring 108 in the plasma chamber 100 of FIG. 1.

Figure 4A:
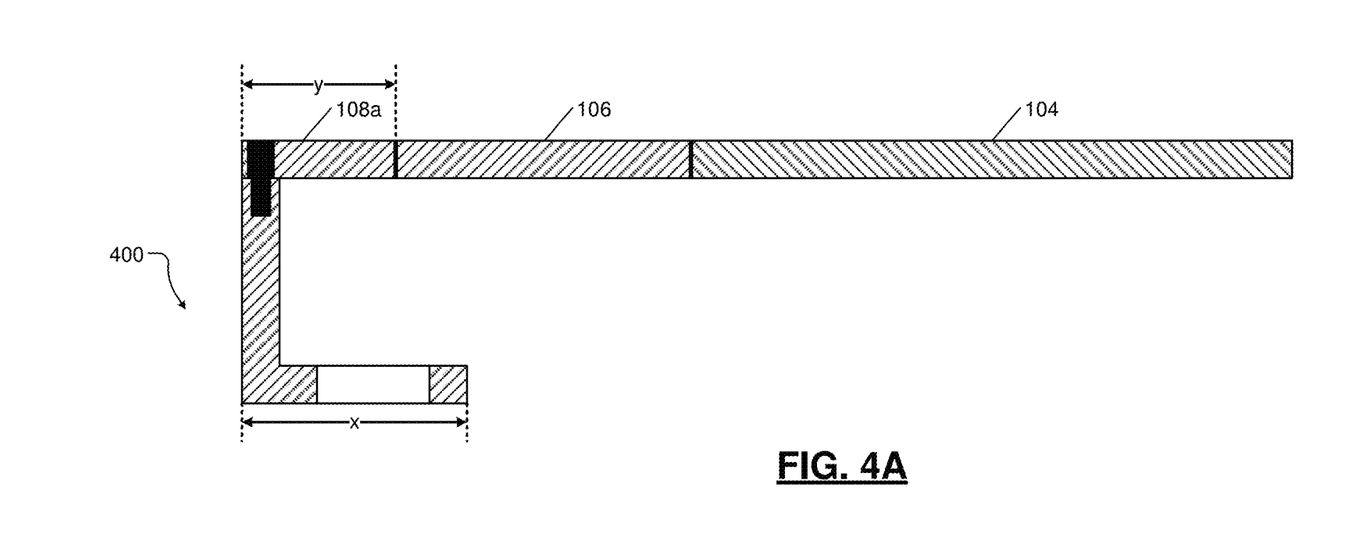
FIGS. 4A and 4B show examples of embodiments utilizing the L-shaped confinement ring in the plasma processing chamber of FIG. 1 according to the present disclosure.
Figure 4B:
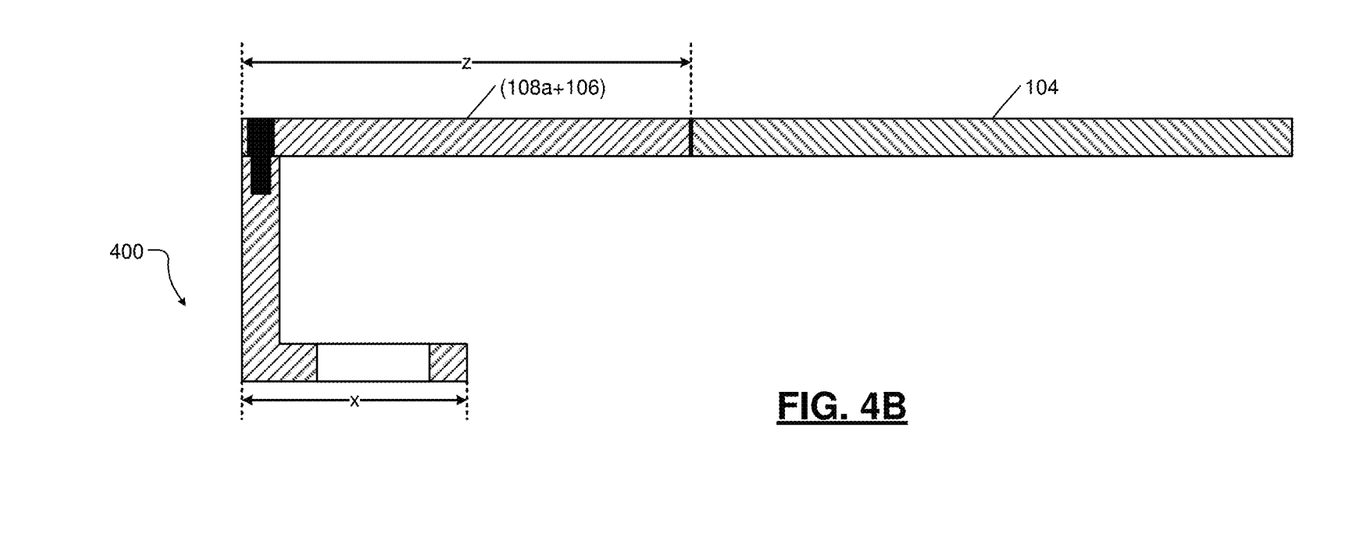

FIGS. 4A and 4B show examples of embodiments utilizing the L-shaped confinement ring in the plasma chamber 100 of FIG. 1 according to the present disclosure. Note that these drawings are not formal mechanical drawings. Rather, these drawings are simplified partial schematics for illustrating the use of the L-shaped confinement ring in the plasma chamber 100 of FIG. 1 according to the present disclosure. To further simplify the illustrations, the partial schematics provide views for only the left side of the plasma chamber 100. Although not shown, it is understood that the structures are similar on the right side of plasma chamber 100.

In a first embodiment shown in FIG. 4A, the horizontal upper portion 108a is separate (i.e., distinct) from the L-shaped confinement ring 400 and is attachable to the L-shaped confinement ring 400 as shown. Further, the horizontal upper portion 108a projects inwardly towards the outer electrode 106 not as far as the lower horizontal portion of the L-shaped confinement ring 400 (i.e., y<x), and contacts the outer edge of the outer electrode 106.

In a second embodiment shown in FIG. 4B, the horizontal upper portion (shown as element 108a+106) is a single element comprising both elements 108a and 106. That is, element 108a is an integral part of or is integrated with element 106. The element (108a+106) can be called an outer electrode portion of the upper electrode 104, 106. The element (i.e., outer electrode) 108a+106 is separate (i.e., distinct) from the L-shaped confinement ring 400 and is attachable to the L-shaped confinement ring 400 as shown. Further, the element 108a+106 projects inwardly towards the inner electrode 104 farther than the lower horizontal portion of the L-shaped confinement ring 400 (i.e., z>x), and contacts the outer edge of the inner electrode 104.

The L shape of the confinement ring 400 provides the following advantages. First, the L-shaped confinement ring 400 is cheaper and easier to manufacture than the C-shaped confinement ring 108. Specifically, due to the L shape, the L-shaped confinement ring 400 uses less silicon than the C-shaped confinement ring 108, which reduces the cost of the L-shaped confinement ring 400 relative to the C-shaped confinement ring 108. Further, due to the L shape, the orifices 402 can be cut by waterjet cutting, which is much faster than other processes (e.g., laser cutting).

Notably, abrasive waterjet cutting process can be used to make the orifices 402 due to the absence of any part opposing the water jet stream (such as the upper portion 108a of the C-shaped confinement ring 108), which can otherwise get damaged as explained above. Furthermore, due to the absence of any part opposing the water jet stream, none of the expensive and time consuming protective measures, which are otherwise necessary when making orifices 108f in the C-shaped confinement ring 108, is needed when making the orifices 402 in the L-shaped confinement ring 400.

Second, the L-shaped confinement ring 400 is the part of the plasma chamber with the greatest wear. The L-shaped confinement ring 400 can be replaced without also replacing the upper portion (e.g., the outer electrode 406 shown in FIG. 3B, or element 108a or 108a+106 shown in FIGS. 4A and 4B). Instead, the outer electrode 406 (or the element 108a or 108a+106) can be removed from the L-shaped confinement ring 400 while replacing the L-shaped confinement ring 400 and can be reattached to the replacement L-shaped confinement ring 400 and reused in the plasma chamber 100.

The L-shaped confinement ring 400 with multiple orifices 402 for plasma confinement and exhaust can be bolted to the upper electrode (i.e., to the outer electrode 406, which is an extended portion of the inner electrode 404) (or to the element 108a or 108a+106) through the threaded holes 408. The orifices 402, which can include holes or radial slots, can be made with high speed and high precision waterjet process, which is much faster than conventional methods using Laser or Electro-discharge machining processes.

The L-shaped confinement ring 400 can be manufactured using CNC. The orifices 402 can be manufactured using abrasive waterjet. Because of the L shape, there is no upper part (such as the upper portion 108a of the C-shaped confinement ring 108) that needs to be protected while making the orifices in the lower portion 400-2. While a bottom surface 108g of the upper portion 108a of the C-shaped confinement ring 108 needs protection when making the orifices 108f in the lower portion 108c, the L-shaped confinement ring 400 does not have an upper portion analogous to the upper portion 108a. Accordingly, the L-shaped design obviates the need for protective measures typically used with the C-shaped confinement ring 108, and the L shape enables much simpler, faster, and cheaper slotting or orifice-making process.

A high precision orifice 402 can be cut directly, which significantly shortens the cutting time by more than about 83% compared to electro-discharge machining and by more than about 75% compared to Laser machining. The L-shaped confinement ring 400 can be easily mounted to (and detached from, after being worn) the upper electrode (here the outer electrode 406 or the element 108a or 108a+106) using threaded holes 408 and bolts.

Figure 5:
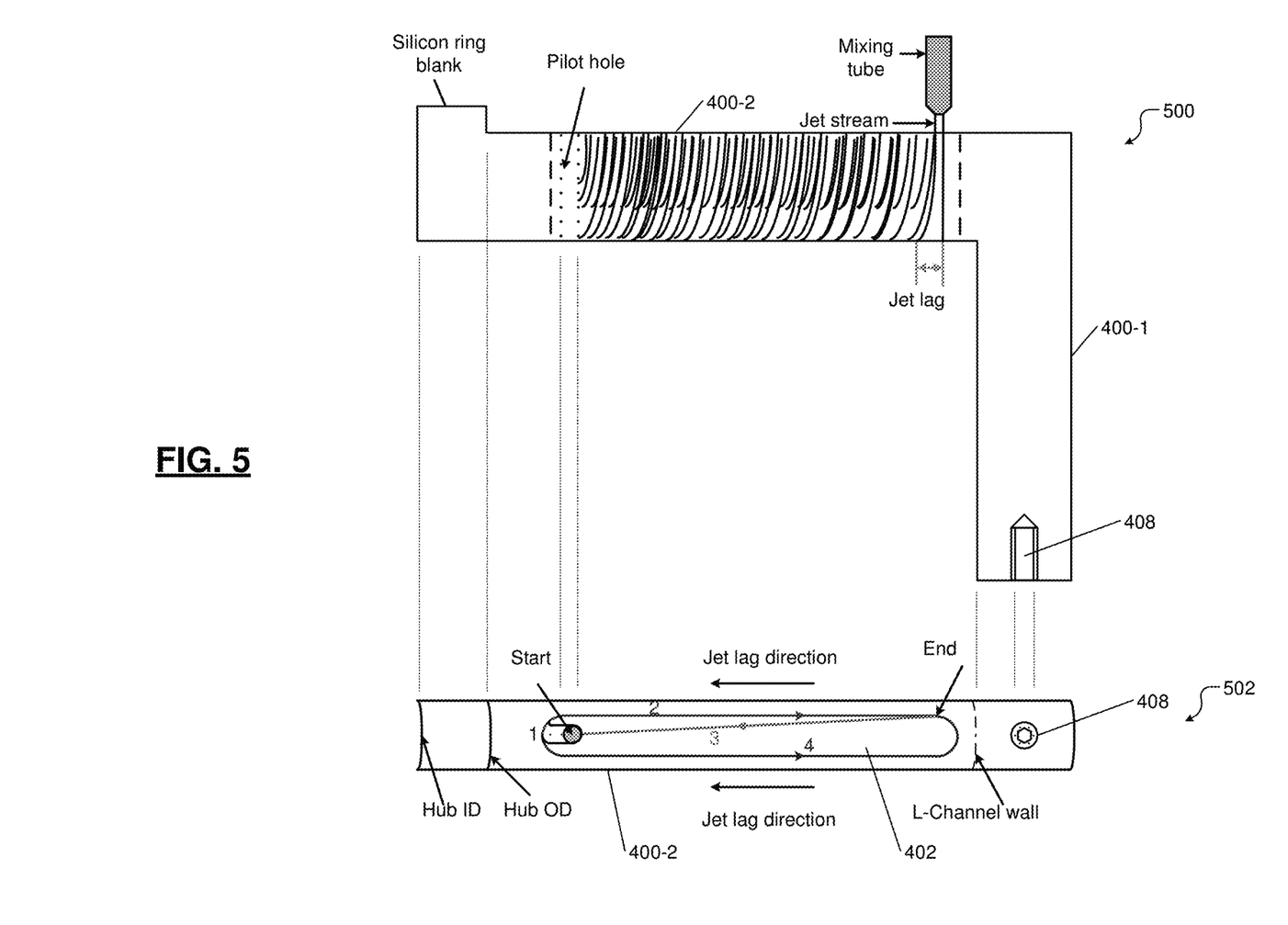
FIG. 5 shows a cross-sectional view and a top view of the L-shaped confinement ring along with a method of using an abrasive waterjet nozzle to cut slots or holes in the L-shaped confinement ring according to the present disclosure.
Figure 6A:
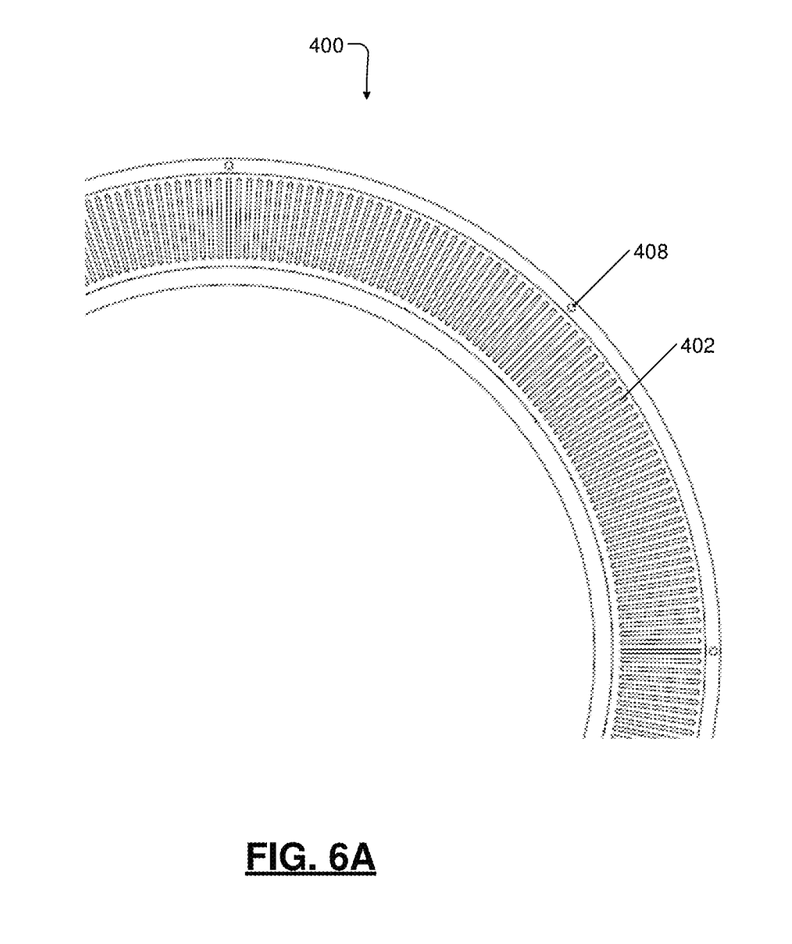
FIGS. 6A and 6B show additional views of the L-shaped confinement ring that is shown in FIGS. 3A and 3B and that is manufactured using the method shown in FIG. 5 according to the present disclosure.
Figure 6B:
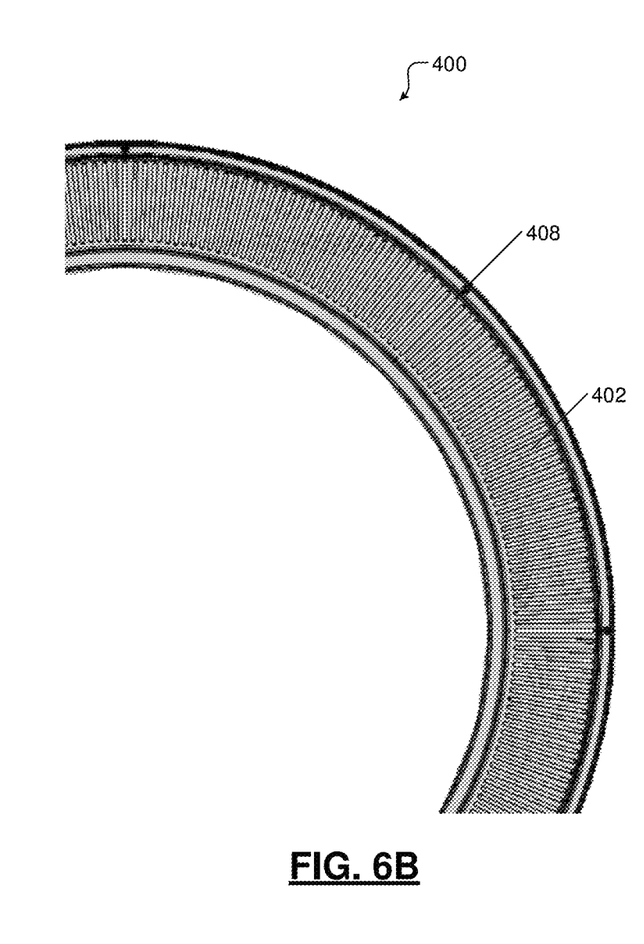

FIG. 5 shows a cross-sectional view 500 and a top view 502 of the L-shaped confinement ring 400 along with a method with which an abrasive waterjet nozzle can cut the orifices 402 from the side with a hub. In a specially designed two-path cutting method shown, the direction of nozzle moment at the two straight sections is away from the center of the L-shaped confinement ring 400. Accordingly, the jet lag is towards the center of the L-shaped confinement ring 400 so that the L-channel wall is not damaged by the jet lag. In addition, the water pressure can be set to the maximum (e.g., 60 ksi) for best surface finish in orifice walls.

Specifically, the abrasive waterjet cutting starts at a pilot hole on the lower (ring-shaped) portion 400-2 of the L-shaped confinement ring 400 and includes a two-path cutting process. The cutting path sequence of the two-path cutting process is identified by numbers 1 through 4 in FIG. 5.

Number 1 shows a starting point of the two-path cutting process from the pilot hole, with the cutting path progressing slightly towards hub inner diameter (ID). Number 2 shows cutting a north part (upper part) of a semicircle at hub ID, followed by cutting straight, with the cutting ending at an intersection between the straight section and a semicircle at hub outer diameter (OD). Number 3 shows traversing back to the pilot hole with water off (i.e., without cutting). Number 4 shows cutting a south part (lower part) of the semicircle at hub ID, followed by cutting straight, and then the semicircle at hub OD.

During each orifice cutting, a core is isolated as the waterjet stream moves around the orifice 402. The isolated core automatically drops off into a water tank of the abrasive waterjet machine when cutting for each orifice is completed at the second ending point of the cutting process (i.e., at the end of number 4). This simplifies the post-waterjet processing of the orifice 402, including CNC machining and cleaning of the orifice 402, which increases the yield.

FIGS. 6A and 6B show additional views of the L-shaped confinement ring 400 manufactured using the method shown in FIG. 5. The views show that the L-shaped confinement ring 400 is an annular structure or component.

Essentially, the L-shaped confinement ring 400 is a structure that can be used to confine plasma in the plasma region 130 between the substrate support assembly and the upper electrode in the plasma chamber 100. In other words, the L-shaped confinement ring 400, the substrate support assembly, and the upper electrode define the plasma region 130 in the plasma chamber 100.

The structure (i.e., the L-shaped confinement ring 400) includes a ring-shaped element (i.e., element 400-2) including a plurality of orifices (i.e., elements 402) and a cylindrical element (i.e., element 400-1) extending vertically upward from the ring-shaped element. The ring-shaped element 400-2 surrounds the substrate support assembly (e.g., element 102 shown in FIG. 1) of the plasma chamber 100. The ring-shaped element 400-2 is arranged along the same plane in which a substrate is arranged on the substrate support assembly. The cylindrical element 400-1 extends from an outer edge of the ring-shaped element 400-2 in a direction perpendicular to the plane in which the substrate is arranged on the substrate support assembly. The structure (i.e., the L-shaped confinement ring 400) is one piece made from a multi-crystal (e.g., of silicon). That is, the structure is monolithic.

A distal (upper) end of the cylindrical element 400-1 includes a plurality of threaded holes 408 to receive screws with which an outer portion of the upper electrode (e.g., the outer electrode 406 extending radially outwardly along the plane from the inner electrode 404, or an outer portion of element 108a or element 108a+106) is screwed to the cylindrical element 400-1. The outer diameters of the cylindrical element 400-1 and the outer electrode 406 are equal.

The cylindrical element 400-1 is a cylindrical wall with a thickness of 3-30 mm and a height of 10-100 mm, for example.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. An L-shaped plasma confinement ring for a plasma chamber, the L-shaped plasma confinement ring comprising:
   a ring-shaped element of the L-shaped plasma confinement ring for the plasma chamber, the ring-shaped element surrounding a substrate support assembly in the plasma chamber and arranged along a plane in which a substrate is arranged on the substrate support assembly in the plasma chamber, the ring-shaped element forming a horizontal portion of the L-shaped plasma confinement ring and including a plurality of orifices; and
   a cylindrical element of the L-shaped plasma confinement ring for the plasma chamber, the cylindrical element forming a vertical portion of the L-shaped plasma confinement ring and extending from an outer edge of the ring-shaped element in a direction perpendicular to the plane in which the substrate is arranged on the substrate support assembly in the plasma chamber,
   wherein the cylindrical element extends uniformly up to a distal end;
   wherein the distal end does not extend in either direction parallel to the plane; and
   wherein the cylindrical element does not extend below the ring-shaped element; and
   wherein the L-shaped plasma confinement ring is monolithic and further comprises a plurality of vertical holes at the distal end of the cylindrical element, the cylindrical element attachable to an upper electrode in the plasma chamber.

2. The L-shaped plasma confinement ring of claim 1 wherein the vertical holes are threaded to receive screws with which the cylindrical element is attachable to the upper electrode of the plasma chamber.

3. The L-shaped plasma confinement ring of claim 1 wherein the ring-shaped element, the substrate support assembly, and the upper electrode define a volume within the plasma chamber in which plasma is confined during processing of the substrate in the plasma chamber.

4. The L-shaped plasma confinement ring of claim 3 wherein outer diameters of the cylindrical element and the upper electrode are equal.

5. The L-shaped plasma confinement ring of claim 1 wherein the cylindrical element is a cylindrical wall with a thickness of 3-30 mm and a height of 10-100 mm.

6. A system comprising: the L-shaped plasma confinement ring of claim 1;
   a lower electrode disposed in the substrate support assembly, the lower electrode arranged parallel to the plane in which the substrate is arranged on the substrate support assembly, wherein the ring-shaped element surrounds the lower electrode; and
   the upper electrode arranged at a height from the lower electrode and parallel to the lower electrode, extending radially outwardly along the plane toward the cylindrical element, and being attachable to the distal end of the cylindrical element.

7. The L-shaped plasma confinement ring of claim 1 wherein the orifices are radially extending slots.

8. The L-shaped plasma confinement ring of claim 1 wherein the orifices are made using an abrasive waterjet cutting process.

* * * * *